(12) United States Patent
Kotowski et al.

(10) Patent No.: US 7,843,260 B2
(45) Date of Patent: Nov. 30, 2010

(54) METHOD AND APPARATUS FOR HIGH PERFORMANCE CLASS D AUDIO AMPLIFIERS

(75) Inventors: Jeff Kotowski, Nevada City, CA (US); Qizhang Yin, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 73 days.

(21) Appl. No.: 12/263,075

(22) Filed: Oct. 31, 2008

(65) Prior Publication Data
US 2010/0109768 A1 May 6, 2010

(51) Int. Cl.
*H03F 3/38* (2006.01)
*H03F 3/217* (2006.01)

(52) U.S. Cl. .......................................... 330/10; 330/251

(58) Field of Classification Search .................... 330/10, 330/207 A, 251
See application file for complete search history.

(56) References Cited

U.S. PATENT DOCUMENTS

| 7,262,658 B2 * | 8/2007 | Ramaswamy et al. ....... 330/251 |
| 2006/0044057 A1 * | 3/2006 | Hezar et al. .................. 330/10 |

* cited by examiner

*Primary Examiner*—Steven J Mottola
(74) *Attorney, Agent, or Firm*—Perkins Coie LLP (57) ABSTRACT

The present disclosure provides a method and apparatus for high performance class D audio amplifier circuit that includes: a modulator circuit for receiving a PWM input signal and generating a control signal, a driver control circuit, a switching circuit, and a feedback circuit. The driver control circuit is adapted to generate a drive signal for the switching circuit. The driving signal provides compensation for noise and distortions in a PWM output signal at each cycle by selecting either a first pulse signal or a second pulse signal based on the information of the control signal.

22 Claims, 7 Drawing Sheets

701 Provide a feedback output signal

702 Quantize the difference between said feedback output signal and an input signal to obtain a control signal 703 Modulate the duty cycle of the output signal using the control signal

*FIG. 7*

METHOD AND APPARATUS FOR HIGH PERFORMANCE CLASS D AUDIO AMPLIFIERS

TECHNICAL FIELD

The present disclosure relates generally to the field of analog integrated circuits, and more specifically, the present disclosure relates to class-D power amplifiers.

BACKGROUND

In recent years, the use of class D amplifiers has become widespread in audio applications. Class D amplifiers are highly efficient and compact, which leads to the reduced cooling requirements and power supply. The operating principle of these class-D power amplifiers is to convert analog or digital audio signals to high frequency pulse width modulation (PWM) signals, and then use the generated PWM signals to drive power MOSFETs in either half-bridge or full-bridge topologies. Passive low pass filters are finally used to convert the output signal of the power MOSFETs into a low frequency analog waveform suitable for audio speakers.

The above approach to implement a class-D amplifier is relatively straightforward. However, to produce high-quality audio signals, there are still a number of issues associated with these amplifiers worth addressing. One major issue is the degradation of the output analog signal by power supply noise and the non-ideal output stage.

For half-bridge topologies, there is no common-mode rejection since they are single-ended by nature, and any noise on the amplifier's power supply will be directly coupled to the output. This undesirable effect becomes even worse for digital class-D amplifiers, in which the power MOSFETs are switched between the supply and the output, and essentially the supply is used as a voltage reference. Hence, without additional noise cancellation structures, the power supply rejection ratio (PSRR) performance of half-bridge class-D amplifiers is unacceptable. Unlike half-bridge topologies, full-bridge class-D amplifiers have sufficient common mode rejection capability to remove the power supply noise effect on the output since the resulting differential output is powered from the same supply. However, they still suffer from the transient behavior of the power supply, which can result from the changes of DC supply level due to load variations. Furthermore, non-ideal power MOSFETs and mismatches in switching circuitry will also degrade the PSRR performance of the full-bridge topologies.

Figure 1:
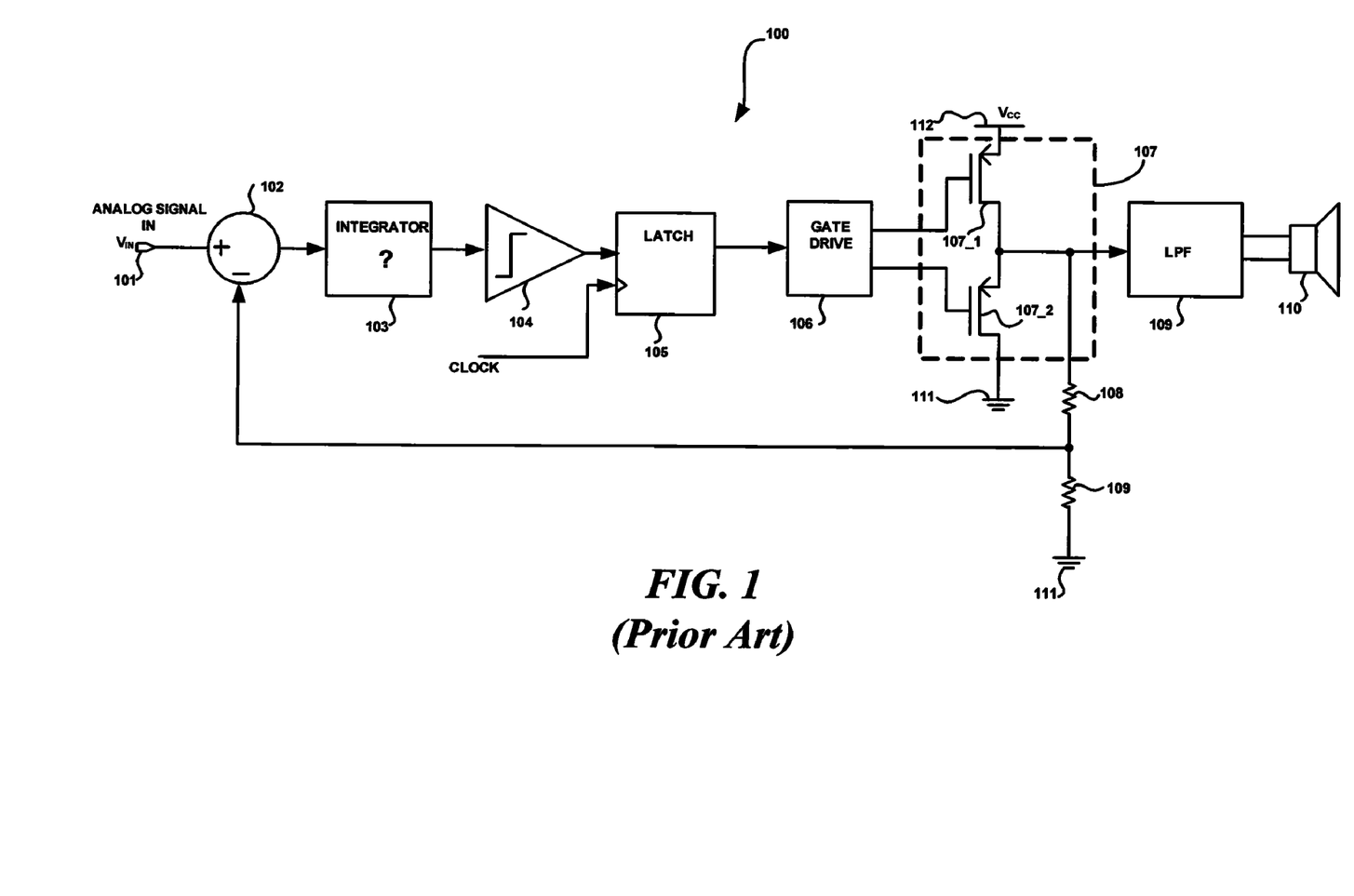
FIG. 1 illustrates a block diagram of a prior art class-D audio amplifier using a sigma delta modulator topology to suppress unwanted noise.

Another approach often used to suppress the noise in a class D audio amplifier is a sigma delta modulator configuration. A sigma delta modulator shapes the noise in high frequency and then uses low pass filters to output only audio analog signals. Referring to FIG. 1, a schematic diagram of a prior-art class D amplifier 100 that illustrates the use of a sigma-delta modulator configuration to improve its noise performance is illustrated. Prior art class D amplifier 100 receives an analog input signal ($V_{IN}$) at an input terminal 101. The sigma delta modulator includes a summing circuit 102, an integrator 103 connected to a comparator 104, and a latch 105 converting the difference between a feedback output signal and the analog input signal ($V_{IN}$) into a bit stream that carries quantized noise spikes imposed on the original analog input signal ($V_{IN}$). A switching circuit 107 including a high-side MOSFET transistor 107_1 and a low-side MOSFET transistor 107_2 operating in push-pull mode is then used to pulse modulate the bit stream. In order to regain the original PWM input signal ($V_{IN}$), a simple LC low pass filter 109 is used to filter out the noise spikes shaped at high frequency. However, the technique has drawbacks for PWM inputs, since the output frequency is not directly controlled and is subject to component variations. Further, distortions caused by non-idealities of the power MOSFET transistors 107_1 and 107_2 and integrator 103 are left uncorrected by prior art class D audio amplifier 100. The time constant of integrator 103 may affect the switching rate of switching circuit 107. Moreover, the inductor current at the output of switching circuit 107 often inadvertently stretches or shortens the pulse widths of the drive signal.

SUMMARY

The present disclosure provides a high performance class D audio amplifier circuit that can handle both noise and distortion. A class D amplifier of the present disclosure includes: a modulator circuit for receiving a PWM input signal and generating a control signal, a driver control circuit, a switching circuit, and a feedback circuit. The driver control circuit is adapted to generate a drive signal for the switching circuit. The drive signal includes compensation for noise and distortion in an output signal at each cycle by selecting either a first pulse signal or a second pulse signal based on the information of the control signal.

A method of providing low signal distortion in a class D audio amplifier is also disclosed that includes: providing a feedback output signal, quantizing the difference signal between the feedback output signal and an input signal to obtain a control signal; and compensating for the output signal at the end of each cycle by modulating the duty cycle of the output signal based on the control signal.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present disclosure, numerous specific details are set forth in order to provide a thorough understanding of the present disclosure. However, it will be obvious to one of ordinary skill in the art that the present disclosure may be practiced without these specific details. In other instances, well-known methods, procedures, components, and circuits have not been described in detail so as not to unnecessarily obscure aspects of the present disclosure.

Figure 2:
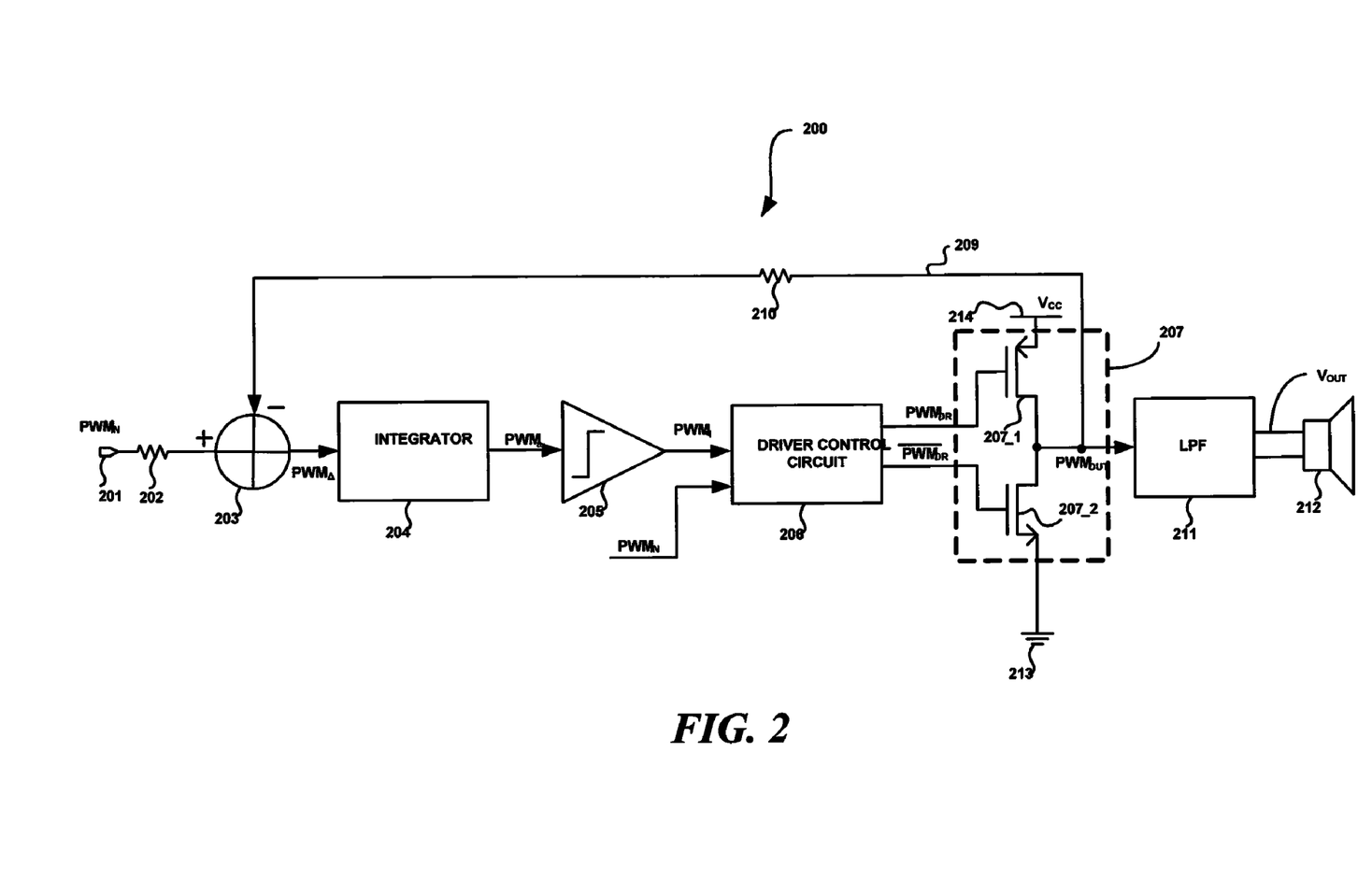
FIG. 2 illustrates a block diagram of a class D audio amplifier having a driver control circuit that provides a compensated drive signal in accordance with an embodiment of the present disclosure.

Turning to FIG. 2, a block diagram showing a structure of a class D audio amplifier 200 in accordance with an embodiment of the present disclosure is illustrated. Class D audio amplifier 200 receives and converts a Pulse Width Modulation input signal ($PWM_{IN}$) into a PWM input current signal using a first resistor 202. An output PWM signal ($PWM_{OUT}$) is also converted into an PWM output current signal using a second resistor 210. The PWM output current signal is fed-back toward input terminal 201 by means of a feedback circuit 209. A subtractor 203 subtracts the PWM input current signal from the PWM output current signal. The resulting difference signal ($PWM_\Delta$) which includes both noise spikes and PWM input signal is introduced into an integrator 204 so that the average value ($PWM_a$) of the difference signal can be estimated. Subsequently, the average value of the difference signal ($PWM_a$) is quantized by a comparator 205 to obtain a control signal ($PWM_q$). Those skilled in the art should realize that 205 herein could be a multi-level circuit, and it is not limited to a comparator. The comparator 205 compares the average difference signal ($PWM_a$) with a first voltage level $V_{REF+}$ and a second voltage level $V_{REF-}$. Only those noise spikes that surpass these two reference values would be quantized into either a logic HIGH signal or a logic LOW signal. In other words, unwanted noise spikes are shaped into high frequency. A driver control circuit 206 receives the control signal ($PWM_q$) and modulates the pulse width of each pulse based on the information contained in the PWM input current signal so as to compensate for the distortions caused by non-idealities of a subsequent switching circuit 207. In one embodiment, driver control circuit 206 selects either a longer pulse signal or a shorter pulse signal whose pulse widths are determined by pulse stretching distortions caused by elements of switching circuit 207. The PWM output signal ($PWM_{OUT}$) is input into a low pass filter 211 where noise is filtered out and only the desired audio signal ($V_{OUT}$) is retained. In addition, in accordance with an embodiment of the present disclosure, any distortion in the pulse width PWM output signal ($PWM_{OUT}$) is also corrected by driver control circuit 206. Finally, the output of low pass filter 211 is connected to an audio speaker 212. Those skilled in the art could realize that for an inductive load, i.e. an inductive speaker, the LPF 211 is not required.

Figure 3:
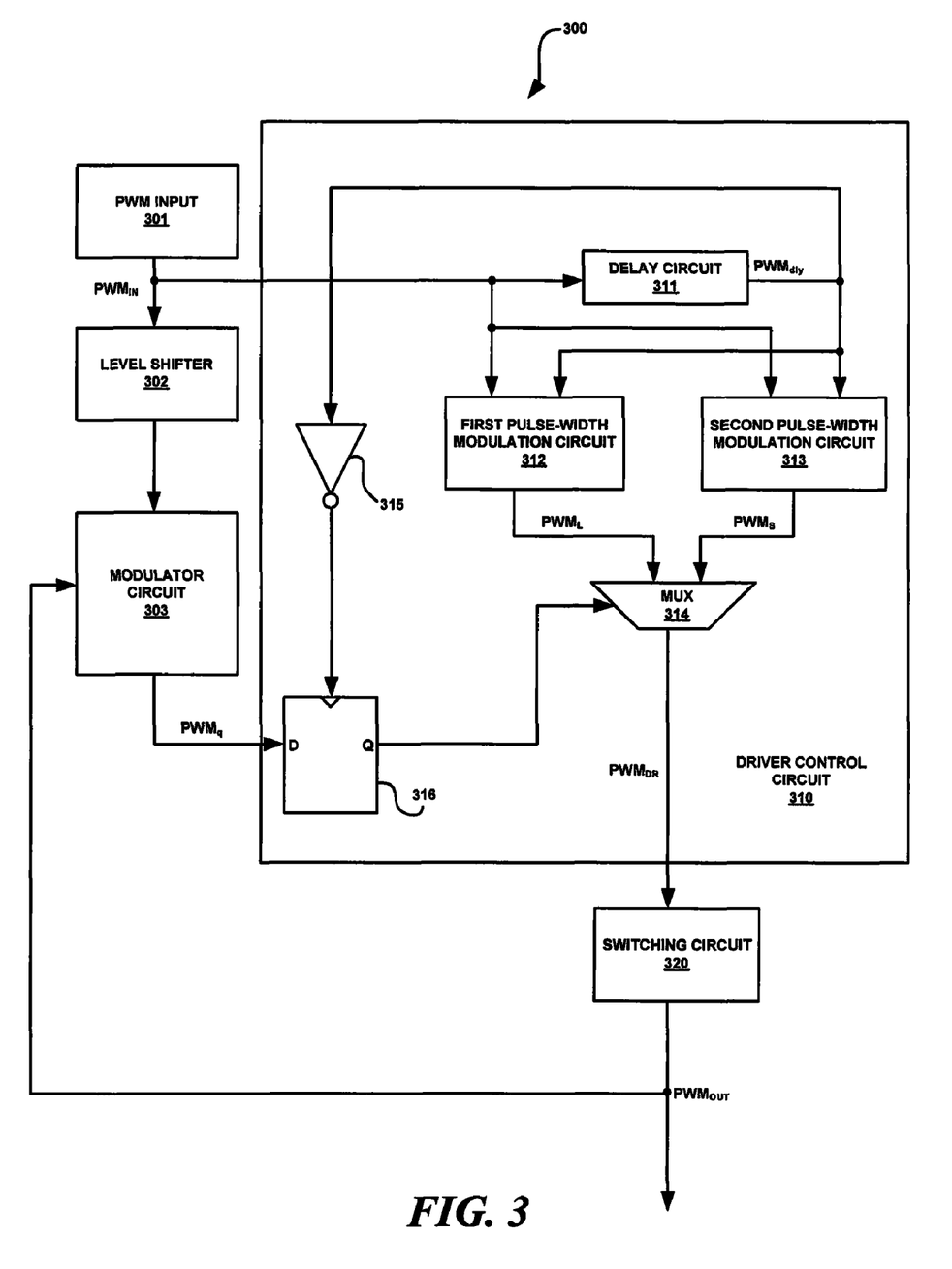
FIG. 3 illustrates a block diagram of a driver control circuit that includes a first pulse-width modulation circuit and a second pulse-width modulation circuit in accordance with an embodiment of the present disclosure.

Referring to FIG. 3, a block diagram of an embodiment of class D audio amplifier 300 that includes a structure of a driver control circuit in accordance with the present disclosure is illustrated. Class D audio amplifier 300 includes a PWM input terminal 301 that receives a PWM input signal ($PWM_{IN}$). Next, a level shifter circuit 302 is connected to the PWM input terminal 301 to bring the PWM input signal to the signal level of power MOSFET transistors of a switching circuit 320. Then a modulator circuit 303 is connected to receive the output of level shifter circuit 302 and the PWM output signal ($PWM_{OUT}$). In one embodiment, the output of level shifter circuit 302 and PWM output signal ($PWM_{OUT}$) are first converted to current signals prior to determining the difference between them. The output of modulator circuit 303 is input to driver control circuit 310. The output of driver control circuit 310, in turn, drives switching circuit 320.

Still referring to FIG. 3, in one embodiment, driver control circuit 310 includes a delay circuit 311, a first pulse-width modulation circuit 312, a second pulse-width modulation circuit 313, a multiplexer 314, a latch 316, and an inverter 315. Delay circuit 311 receives a PWM input signal ($PWM_{IN}$) to generate a delayed signal ($PWM_{dly}$). Next, the delayed signal ($PWM_{dly}$) is coupled to first pulse-width modulation circuit 312 and second pulse-width modulation circuit 313 respectively. An output ($PWM_L$) of first pulse-width modulation circuit 312 and an output ($PWM_S$) of second pulse-width modulation circuit 313 are coupled to multiplexer 314. Latch 316 is coupled to receive control signal ($PWM_q$) from modulator circuit 303 at an input terminal of latch 316. The clock terminal of latch 316 is connected to the output of inverter 315 whose input terminal is connected to the output ($PWM_{dly}$) of delay circuit 311. The operation of class D audio amplifier 300 with driver control circuit 310 will be described in detail below with reference to FIG. 5 and FIG. 6.

Figure 4:
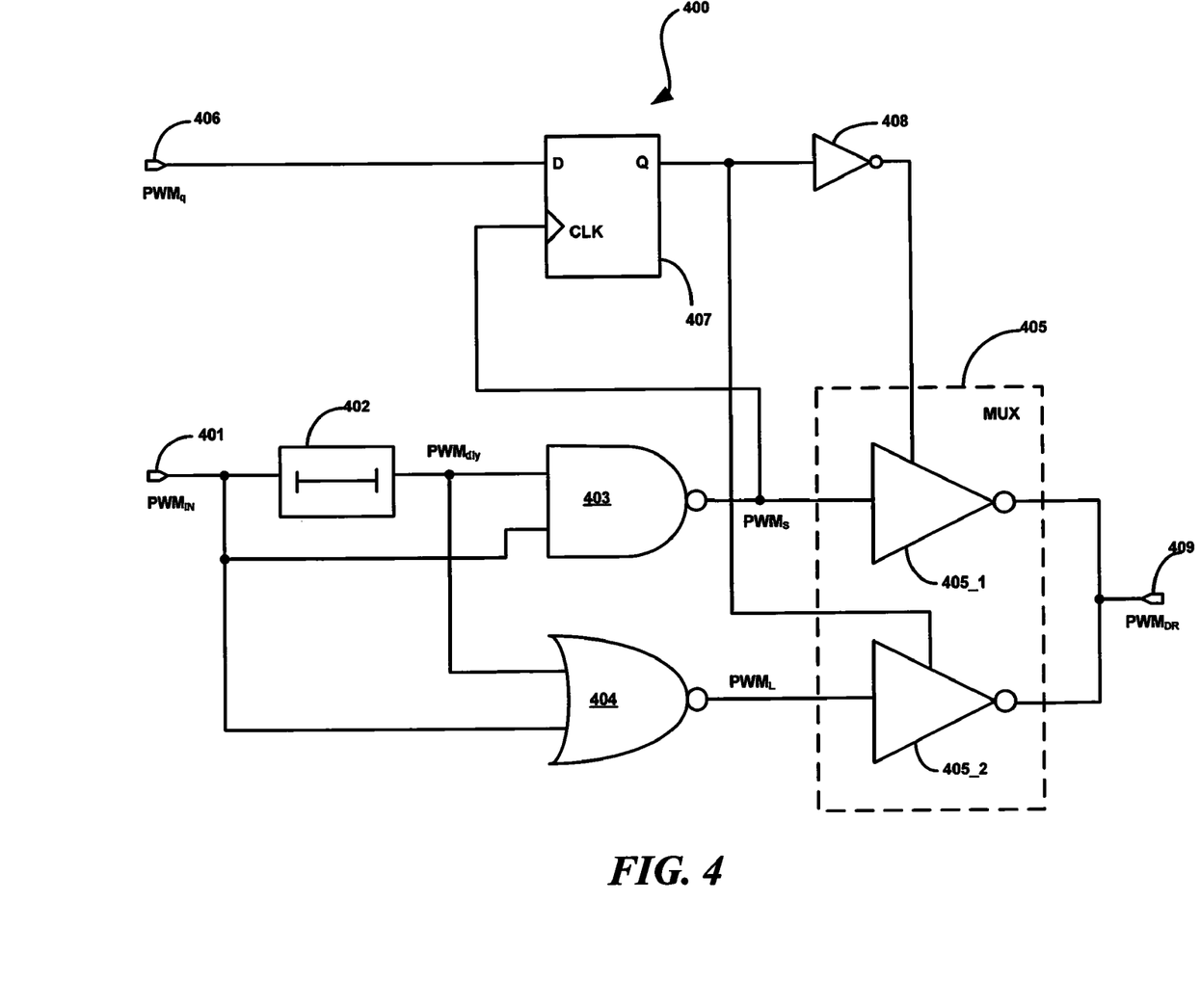
FIG. 4 illustrates a schematic diagram of an embodiment of a driver control circuit of the present disclosure.

Turning to FIG. 4, a schematic diagram of a driver control circuit 400 in accordance with an embodiment of the present disclosure is illustrated. Structurally, driver control circuit 400 includes a delay circuit 402 connected to an input terminal 401 adapted to receive a Pulse Width Modulation input signal ($PWM_{IN}$). The output of delay circuit 402 is connected to a NAND gate 403 and a NOR gate 404. In this embodiment, NAND gate 403 is an example of first pulse-width modulation circuit 312 while NOR gate 404 is an example of second pulse-width modulation circuit 313 in FIG. 3. The other input terminals of both NAND gate 403 and NOR gate 404 are connected to input terminal 401. The output terminal of NOR gate 404 is input to a multiplexer 405. An output terminal 409 outputs either an output signal ($PWM_S$) of NAND gate 403 or an output signal of NOR gate 404 ($PWM_L$) depending on a command of a latch 407 connected to an inverter 408. In one embodiment, latch 407 is a clocked D flip flop.

The D input terminal of clocked D flip flop 407 is connected to receive a control signal ($PWM_q$) from modulator circuit 303 at terminal 406. The Q output terminal of clocked D flip flop 407 is connected to the input terminal of inverter 408 and to a second selecting terminal of multiplexer 405. The output terminal of inverter 408 is connected to a first selecting terminal of multiplexer 405. In one embodiment, as shown in FIG. 4, multiplexer 405 includes a first inverter 405_1 and a second inverter 405_2.

Figure 5:
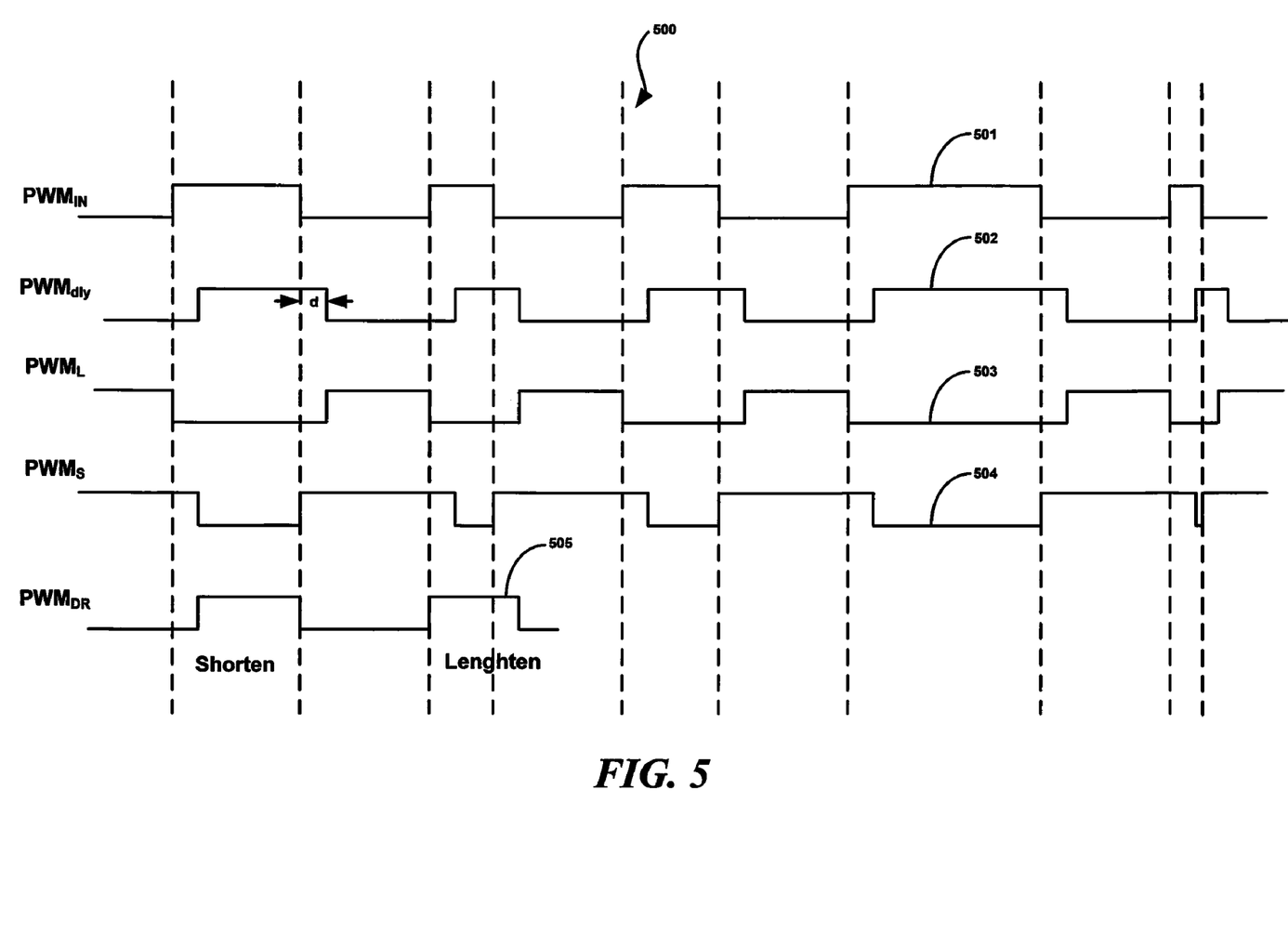
FIG. 5 illustrates timing diagrams showing the operation of the driver control signal shown in FIG. 4 in accordance with an embodiment of the present disclosure.

Referring now to FIG. 5, signal graphs 500 (also referred to as signal timing diagrams) of PWM signals of driver control circuit 400 in accordance with an embodiment of the present disclosure is shown. A representative PWM input signal ($PWM_{IN}$) received at input terminal 401 is illustrated by graph 501. As shown, PWM input signal ($PWM_{IN}$) 501 is a Pulse Width Modulation signal with varying pulse widths. A graph 502 that represents an output of delay circuit 402 ($PWM_{dly}$) is shown. The delayed signal ($PWM_{dly}$) 502 is PWM input signal ($PWM_{IN}$) delayed by a delay amount δ. In one embodiment, delay value δ is carefully chosen to be larger than the equivalent pulse width of the maximum difference between the desirable PWM output signal ($PWM_{OUT}$) and the distorted PWM output signal. Otherwise, feedback loop 209 cannot correct the distorted PWM output signal ($PWM_{OUT}$) in the worst case scenario. Next, a graph 504 that represents the output signal ($PWM_S$) of NAND gate 403 is shown. As shown in FIG. 4, NAND gate 403 receives PWM input signal (PWM$_{IN}$) at its first input terminal and the delayed PWM input signal (PWM$_{dly}$) at its second input terminal. The output signal (PWM$_S$) only goes HIGH when either input signal goes LOW. On the other hand, graph 503 representative of an output signal (PWM$_L$) of the output of NOR gate 404 is shown. Naturally, the output signal (PWM$_L$) signal only goes HIGH when both input signals to NOR gate 404 go LOW. Finally, the drive signal (PWM$_{DR}$) of multiplexer 405 is illustrated by a graph 505. In one embodiment, clocked D flip flop 407 is clocked by the output signal (PWM$_S$) of NAND gate 403. Every time the output signal (PWM$_S$) goes LOW, clocked D flip flop 407 latches out either a shorted PWM signal (PWM$_S$) or a stretched PWM signal (PWM$_L$).

Referring back to FIG. 2, FIG. 4, and FIG. 5, it can be seen that PWM input signal (PWM$_{IN}$) which is the desirable signal from input terminal 201, and the delayed version (PWM$_{dly}$) enter NAND gate 403 and NOR gate 404 respectively. The resulting output will be a PWM signal with shorter pulse width (PWM$_S$) at the output of NAND gate 403 and/or a PWM signal with longer pulse width (PWM$_L$) at the output of NOR gate 404. Each cycle, one of these two PWM signals (PWM$_L$ and PWM$_S$) is selected to be applied to the gates of MOSFET transistors 207_1 and 207_2, which is determined by the control signal from the output of comparator 205. For instance, at the end of one cycle, the output of comparator 205 turns to be high, which means the average voltage value of the distorted PWM output signal (PWM$_{OUT}$) is smaller than that of the desirable input PWM signal (PW$_{MIN}$). Thus, this is an unwanted shortening in pulse width of PWM output signal (PWM$_{OUT}$). To correct this distorted PWM output signal (PWM$_{OUT}$), an PWM with longer pulse width (PWM$_L$) than the desirable input PWM input signal (PW$_{MIN}$) is required to be applied to the gates of MOSFET transistors 207_1 and 207_2; thus this "high" control signal selects the signal (PWM$_L$) at the output of the NOR gate 404 through a clocked D flip-flop 407, so that in the next cycle a PWM signal with longer pulse width than that of the PWM input signal (PW-M$_{IN}$) is applied to the gates of MOSFET transistors 207_1 and 207_2.

On the other hand, if the control signal turns to be low, which means the average voltage value of the distorted PWM output signal (PWM$_{OUT}$) is larger than that of the desirable input PWM input signal (PWM$_{IN}$). So, this is a case of unwanted stretch in the pulse width of the PWM output signal (PWM$_{OUT}$). Therefore, a PWM signal with a narrower pulse width (PWMS) at the output of NAND gate 403 is selected to compensate the difference between the desirable PWM input signal (PWM$_{IN}$) and the distorted PWM output signal (PWM$_{OUT}$).

Figure 6:
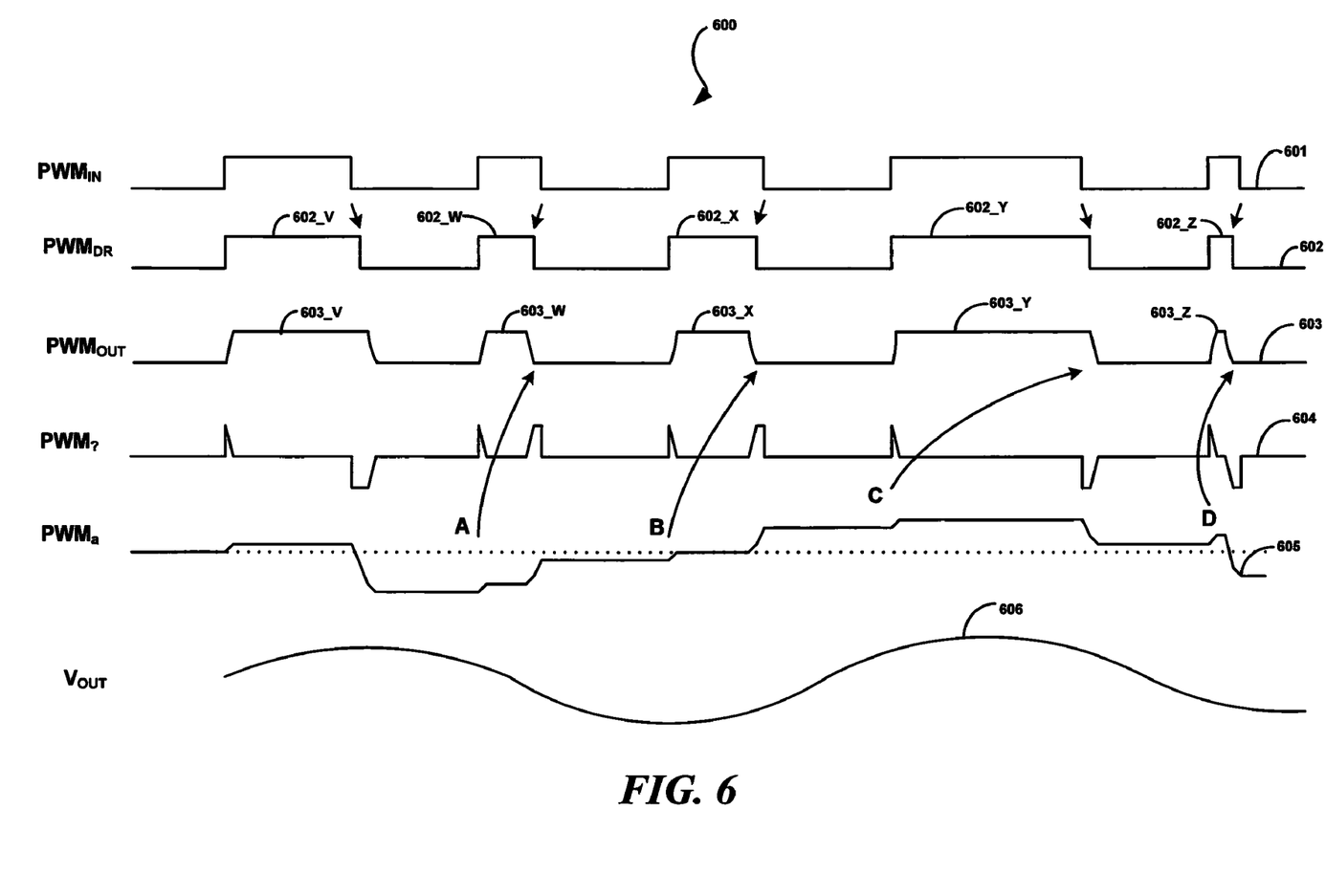
FIG. 6 illustrates timing diagrams showing the operation of the class D audio amplifier circuit of FIG. 2 in accordance with an embodiment of the present disclosure.

Now referring to FIG. 6, a series of graphs 600 illustrating the operation of class D audio amplifier 400 of FIG. 4 is shown. Again, a graph 601 of the input PWM input signal (PWM$_{IN}$) at terminal 301 is shown. Next, a graph 602 represents the drive signal (PWM$_{DR}$) at the output of multiplexer 314 is shown. As shown in graph 602, the falling edge of each pulse is either stretched or shortened. More particularly, a first pulse 602_V is stretched out and a second pulse 602_W is shortened at their respective falling edge. Similarly, a third pulse 602_X is shorted while a fourth pulse 602_Y is stretched out at their relative falling edge. Some of the causes of the delays could be finite rise, nonlinear rise time due to power devices of switching circuit 320, and/or linear or nonlinear delays through the system. Nonlinear rise time errors may cause by the turn-on time of power devices inside switching circuit 320, and/or body diode recovery time, etc.

Continuing with FIG. 6, each pulse at the input of switching circuit 320 creates a corresponding pulse at its output terminal which is represented by a graph 603. At a pulse 603_V, there is a small negative error at the rising edge. Obviously, the PWM output signal (PWM$_{OUT}$) can not change until drive signal (PWM$_{DR}$) changes, so there is a delay. These unwanted delays will cause high-side power MOSFET transistor 207_1 and low-side MOSFET transistor 207_2 to be turned ON or turned OFF slowly. Consequently, instantaneous inductor current (I$_L$) in low pass filter 211 will cause distortions in the pulse width of drive signal (PWM$_{DR}$). An inductor current (I$_L$) that flows toward input terminal 201 will cause unwanted stretch in the pulse width of PWM output signal (PWM$_{OUT}$). Otherwise, an inductor current (I$_L$) that flows out toward output filter 211 will cause unwanted shortening in the pulse width of PWM output signal (PWM$_{OUT}$). Thus, a graph 604 shows the difference signal (PWM$_A$) that contains the signal distortions of PWM output signal (PWM$_{OUT}$). A graph 605 representing the average difference signal after integrator 204 is also illustrated. Finally, a graph 606 illustrates the audio output signal (V$_{OUT}$) received at the output of low pass filter 211. Graph 606 is achieved after noise spikes have been filtered out by low pass filter 211 and pulse width distortions are compensated by driver control circuit 206.

Figure 7:
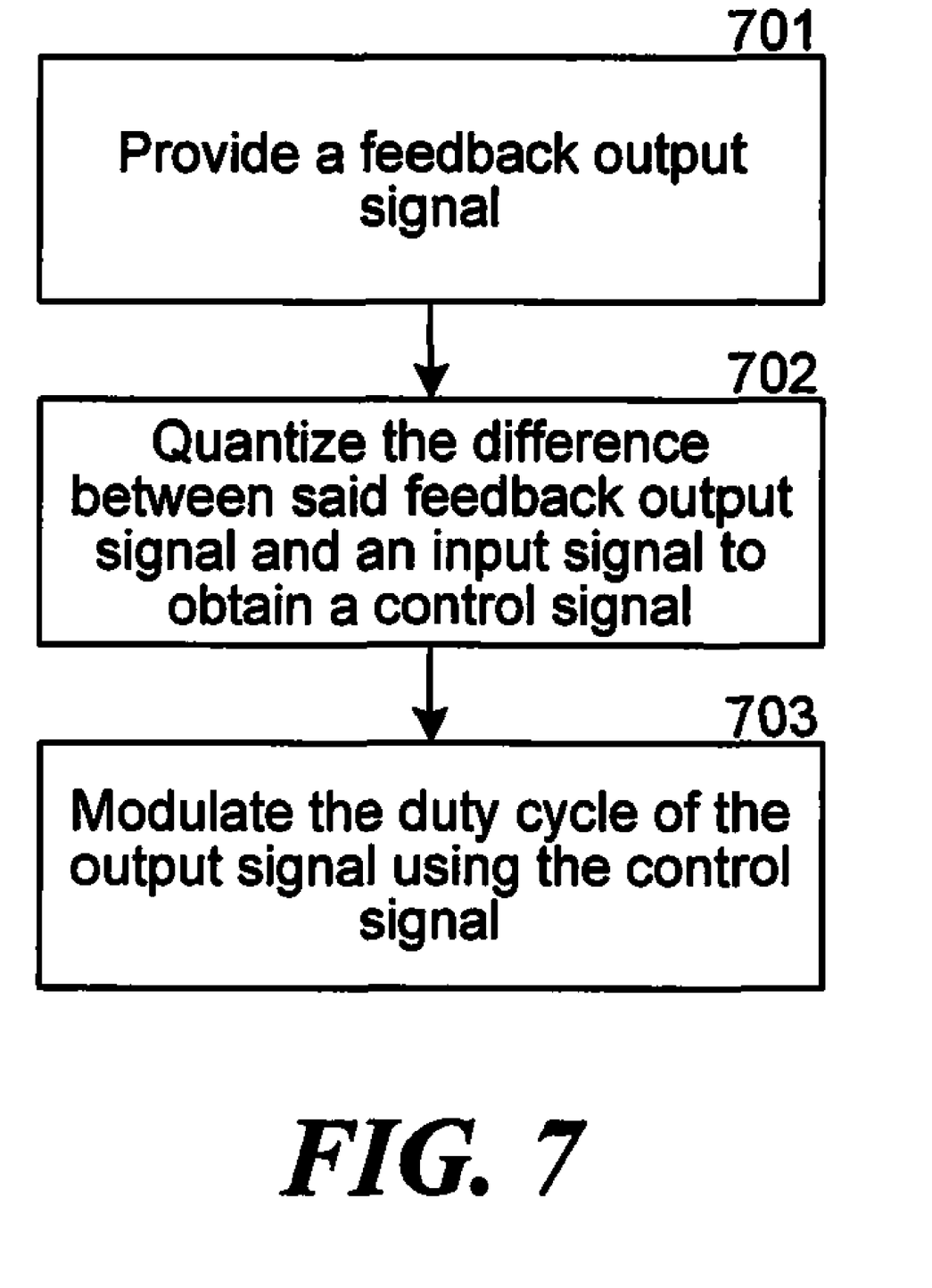
FIG. 7 illustrates a flow chart of a method of achieving high quality audio signal in a class-D audio amplifier in accordance with an embodiment of the present disclosure.

Referring next to FIG. 7, a flow chart that illustrates a method 800 of providing a low distortion signal in a class D audio amplifier is illustrated. Method 700 includes providing a feedback output signal, quantizing the difference signal between the feedback output signal and an input signal to obtain a control signal; and compensating for the output signal at the end of each cycle by modulating the duty cycle of the output signal based on the control signal.

More particularly, at step 701, a feedback output signal is provided. In one embodiment, step 701 further includes converting a Pulse Width Modulation input signal (PWM$_{IN}$) into an input current signal and converting an output of a switching circuit (PWM$_{OUT}$) into an output second current signal. Then, the output second current signal is fedback to be subtracted from the input current signal. Step 701 is implemented by a feedback path 209, a first resistor 202, and a subtractor 203.

Next, at step 702, the difference between the feedback output signal and the input signal is quantized to obtain a control signal. Step 702 is implemented by integrator 204 connected between subtractor 203 and comparator 205 as shown in FIG. 2. The control signal selects whether a longer pulse signal or a shorter pulse signal is selected to drive switching circuit 207.

Finally, referring to step 703, at each cycle, the pulse width of the driving signal that drives the switching circuit is modulated using the control signal. In particularly, the control signal selects a longer pulse when the PWM output signal is shortened. On the other hand, the control signal selects a shorter pulse when the PWM output signal is stretched by power MOSFET transistors 207_1 and 207_2. Step 703 is implemented by driver control circuit 310 and class D audio amplifier 300. In one embodiment, step 703 is implemented by driver control circuit 400 in FIG. 4 of the present disclosure.

Modifications and variations of the present disclosure are possible in light of the above teachings. It is therefore to be understood that within the scope of the appended claims the invention may be practiced otherwise than as specifically described. It should be understood, of course, the foregoing disclosure relates only to a specific embodiment (or embodiments) of the invention and that numerous modifications may be made therein without departing from the spirit and the scope of the invention as set forth in the appended claims. Various modifications are contemplated and they may be resorted to by those skilled in the art without departing from the spirit and the scope of the invention as hereinafter defined by the appended claims as only a specific embodiment(s) thereof has been disclosed.

We claim:

1. A class D audio amplifier, comprising:
   a modulator circuit, electrically coupled to receive a Pulse Width Modulation (PWM) input signal, operable to provide a control signal;
   a driver control circuit, electrically coupled to said modulator circuit, operable to generate a drive signal that provides compensation in a PWM output signal at each cycle by selecting either a first pulse signal or a second pulse signal based on said control signal;
   a switching circuit, electrically coupled to said driver control circuit, operable to switch on and off to generate said PWM output signal in response to said drive signal; and
   a feedback circuit, electrically coupled to said switching circuit and to said modulator circuit, operable to provide a feedback of said PWM output signal.

2. The class D audio amplifier of claim 1 wherein said modulator circuit provides said control signal by quantizing the average difference value between said PWM input signal and said feedback of said PWM output signal.

3. The class D audio amplifier of claim 1 further comprises:
   an input terminal, electrically coupled to said modulator circuit, for receiving said PWM input signal; and
   an output terminal, electrically coupled to said switching circuit, for outputting an analog audio signal.

4. The class D audio amplifier of claim 1 further comprising:
   an output filter, electrically coupled to said switching circuit, operable to generate said analog audio signal in response to said PWM output signal.

5. The class D audio amplifier of claim 1 further comprising:
   a first converter, electrically coupled to said modulator circuit, operable to convert said PWM input signal into a PWM input current signal; and
   a second converter, electrically coupled to said switching circuit, operable to convert said PWM output signal into a PWM output current signal.

6. The class D audio amplifier of claim 4 wherein said first converter further comprises a first resistor and said second converter further comprises a second resistor.

7. The class D audio amplifier of claim 1 further comprising:
   a level shifter circuit, electrically coupled between said input terminal and said modulator circuit.

8. The class D audio amplifier of claim 1 wherein said driver control circuit further comprises:
   a delay circuit electrically coupled to receive said PWM input signal;
   a first pulse-width modulation circuit electrically coupled to said delay circuit operable to generate said first pulse signal that has a pulse width longer than the pulse width of said PWM output signal;
   a second pulse-width modulation circuit electrically coupled to said delay circuit operable to generate said second pulse signal that has a pulse width that is shorter than the pulse width of said PWM output signal;
   a multiplexer electrically coupled to said first pulse width modulation (PWM) generator and to said second pulse width modulation (PWM) generator, operable to select either said first pulse signal or said second pulse signal; and
   a selector circuit, electrically coupled to said multiplexer and to said modulator circuit, operable to cause said multiplexer circuit to select either said first pulse signal or said second pulse signal depending on said control signal.

9. The class D audio amplifier of claim 8 wherein said selector circuit further comprises:
   an inverter electrically coupled to said delay circuit; and
   a flip-flop circuit electrically coupled to said inverter, to said multiplexer, and to said modulator circuit.

10. The class D audio amplifier of claim 8 wherein said first pulse width modulation circuit further comprises a NOR circuit.

11. The class D audio amplifier of claim 8 wherein said second pulse width modulation circuit further comprises a NAND circuit.

12. The class D audio amplifier of claim 1 wherein said switching circuit further comprises a plurality of MOSFET transistors electrically connected together in a half bridge topology.

13. The class D audio amplifier of claim 12 wherein said plurality of MOSFET transistors further comprises a high-side MOSFET device and a low-side MOSFET device, said high-side MOSFET device electrically coupled in series to said low side MOSFET device, the gate of said high-side MOSFET device electrically coupled to said driver control circuit, the drain of said high-side MOSFET device electrically coupled to a first supply voltage, the source of said high-side MOSFET device electrically coupled to the drain of said low-side MOSFET device, the gate of said low-side MOSFET device electrically coupled to said driver control circuit, the source of said low side MOSFET device electrically coupled to a second supply voltage.

14. The class D audio amplifier of claim 1 wherein said switching circuit further comprises a plurality of MOSFET transistors electrically connected together in a full bridge topology.

15. The class D audio amplifier of claim 14 wherein said switching circuit further comprises:
   a first high-side MOSFET device, the gate of said first high-side MOSFET device electrically coupled to said driver control circuit, the drain of said first high side MOSFET device electrically coupled to a first supply voltage;
   a first low-side MOSFET device, the source of said first high-side MOSFET device electrically coupled to the drain of said first low-side MOSFET device, the gate of said first low-side MOSFET device electrically coupled to said driver control circuit, the source of said first low-side MOSFET device electrically coupled to a second supply voltage;
   a second high-side MOSFET device, the gate of said second high-side MOSFET device electrically coupled to said driver control circuit, the drain of said second high-side MOSFET device electrically coupled to said first supply voltage; and
   a second low-side MOSFET device, the source of said second high-side MOSFET device electrically coupled to the drain of said second low-side MOSFET device, the gate of said second low-side MOSFET device electrically coupled to said driver control circuit, the source of said second low-side MOSFET device electrically coupled to said second supply voltage.

16. The class D audio amplifier of claim 3 wherein said modulator circuit further comprises:
- a subtractor electrically coupled to said input terminal and to said feedback circuit;
- an integrator electrically coupled to said subtractor; and
- a comparator electrically coupled to said integrator.

17. A method of generating an analog signal comprising:
- providing a feedback output signal;
- quantizing the difference between said feedback output signal and an input signal to obtain a control signal; and
- modulating the duty cycle of said output signal based on said control signal, wherein said modulating of the duty cycle of said output signal comprises selecting either a first pulse signal or a second pulse signal according to said control signal.

18. The method of claim 17 wherein the pulse widths of said first and said second pulse signals depend on said control signal.

19. The method of claim 17 wherein said modulating the duty cycle of said output signal further comprises:
- selecting a predetermined delay value for said input signal;
- delaying said input signal by said predetermined delay value so as to generate a said first pulse signal and said second pulse signal; and
- selecting either said first pulse signal or said second pulse signal.

20. The method of claim 17 further comprising filtering said output signal to generate an audio analog signal.

21. The method of claim 17 wherein said providing a feedback output signal further comprises converting said input signal into an input current signal and converting said output signal into an output current signal.

22. The method of claim 17 wherein said quantizing the difference between said feedback output signal from an input signal further comprises:
- subtracting said feedback output signal from said input signal to obtain a difference signal;
- integrating said difference signal to obtain an average signal; and
- comparing said average signal to a first level signal and a second level signal to obtain said control signal.

* * * * *